United States Patent [19]

Schade, Jr.

[11] 4,199,733
[45] Apr. 22, 1980

[54] EXTENDED-DRAIN MOS MIRRORS

[75] Inventor: Otto H. Schade, Jr., N. Caldwell, N.J.

[73] Assignee: RCA Corporation, New York, N.Y.

[21] Appl. No.: 945,601

[22] Filed: Sep. 25, 1978

[30] Foreign Application Priority Data

Jan. 19, 1978 [GB] United Kingdom ............... 659/78
Sep. 14, 1978 [GB] United Kingdom ............ 36789/78

[51] Int. Cl.² ............................................. H03F 3/16
[52] U.S. Cl. ................................. 330/277; 330/288; 330/307; 357/23; 357/41
[58] Field of Search ............... 330/277, 288, 300, 307; 357/41, 23

[56] References Cited

U.S. PATENT DOCUMENTS

| | | | |
|---|---|---|---|
| 3,391,311 | 7/1968 | Lin et al. | 357/40 |
| 3,947,778 | 3/1976 | Hsiao et al. | 307/279 X |
| 3,953,807 | 4/1976 | Schade, Jr. | 330/277 |
| 4,015,146 | 3/1977 | Aihara | 307/304 |
| 4,064,506 | 12/1977 | Cartwright, Jr. | 307/304 X |

*Primary Examiner*—James B. Mullins
*Attorney, Agent, or Firm*—Paul J. Rasmussen; Allen LeRoy Limberg; Eric P. Herrmann

[57] ABSTRACT

An improved current amplifier, of the type having input, output and common terminals and which is subject to having widely dissimilar voltages at its input and output terminals has field-effect master and slave transistors formed in a region of semiconductor substrate having an impurity concentration gradient such that the material resistivity increases in a direction into the substrate and provided with relatively deep drain extensions.

6 Claims, 4 Drawing Figures

EXTENDED-DRAIN MOS MIRRORS

The present invention relates to integrated circuits relying upon field effect transistors (FET's) with proportional conduction characteristics, e.g., to current mirror amplifiers using FET's as master and slave mirroring transistors and having current gain(s) dependent upon the ratio of the conduction by the slave mirroring transistor(s) to the conduction by the master mirroring transistor.

The term "current mirror amplifier" or "CMA" generally describes a linear inverting current amplifier of the kind comprising: current-to-voltage converter means responsive to the amplifier input current for producing a voltage; a voltage-to-current converter means responsive to said voltage for producing the amplifier output current and wherein each converter means exhibits a respective current/voltage characteristic, which may be non-linear, said characteristics being related by a factor G independent of the magnitude of the current being amplified and being selected to track each other with changes in temperature for providing an overall amplifier gain wherein the ratio of output current to input current magnitudes equals the factor G over substantial ranges of both temperature and the magnitude of the amplified current.

In the context of the above, the current-to-voltage converter means will be more especially, a "master" mirroring transistor of field effect type being conditioned to conduct applied input current between its drain and source electrodes by a feedback connection between its drain and gate electrodes. The input current is thus converted to a voltage ($V_{GS}$) between its gate and source electrodes commensurate with the drain-source current conducted. The generated $V_{GS}$ is applied as a gate-to-source voltage to at least one "slave" mirroring transistor of field effect type and similar conductivity type to the master mirroring transistor. Each slave mirroring transistor functions as a voltage-to-current converter to form, in conjunction with the master mirroring transistor, a current mirror amplifier.

Previously, in circuit applications CMA's using FET's as master and slave mirroring transistors have incorporated (a) source degeneration resistors in series connection with the mirroring transistors or (b) means for constraining the drain-to-source voltages ($V_{DS}$'s) of the mirroring transistors to be either constant or alike. Otherwise the gain factor G undesirably changes with change in the $V_{DS}$ of either of the mirroring transistors. This shortcoming results from the phenomenon known as "channel shortening" wherein the effective channel length and thus the conductance of a field effect transistor is modulated by the potential applied to the channel extremities, i.e., the drain and source electrodes. Channel shortening is similar to the "Early effect" which occurs in bipolar devices, but generally is more pronounced than the Early effect, especially in short-channel or high-transconductance devices.

Still one desires to use FET's as mirroring transistors in CMA designs despite the additional structural elements which may be required to keep their $V_{DS}$'s constant. FET's require no input current to their control or gate electrodes, while the base currents of bipolar transistors are prone to introducing variations into the G factor owing to variations in manufacturing and in transistor operating temperature. FET's tend to be wider bandwidth devices than lateral structure bipolar transistors and have a structure more conducive to matching of output-current to input-voltage characteristics of master and slave mirroring transistors. Accordingly, it has been the practice (as described in U.S. Pat. No. 3,953,807, issued Apr. 27, 1976, to Otto Schade, Jr. and entitled "Current Amplifier") to obtain CMA's with more constant current gain despite input and output voltage variations by combining a simple CMA using FET's with other circuitry for keeping their $V_{DS}$ constant. This circuitry undesirably introduces additional complexity into the CMA and increases the voltage required across the input and output circuits of the CMA for proper operation. The very desirable feature of a simple CMA using FET's, that the channel of each slave FET can provide a clamp with very small voltage offset across it, is lost. So, a way to make the current gain of a simple CMA using FET's independent of variations in its input and output voltages has been sought.

CMA's heretofore have employed FET's which are fabricated in substrates having uniform impurity concentrations or in locally doped regions called wells which are common to complementary metal-oxide-semiconductor or CMOS devices and which have either no drain extensions or relatively shallow drain extensions compared to the depth of the degenerate drain region from the active surface of the substrate. A drain extension is defined here as a region of semiconductor material of the same conductivity type as the FET's drain and source regions which extends beyond the periphery of the drain region, at least at the surface of the substrate where the FET structure is disposed, and which has a lower impurity concentration than the drain and source regions. Drain extensions are typically utilized to increase the drain-to-source breakdown potential of FET's. As an example, an FET fabricated in a typical CMOS digital circuit designed to have a drain-source breakdown of at least 15 volts may have drain regions with a surface concentration of $10^{20}$ impurity atoms per $cm^3$ which extend from the surface of the substrate to a depth of 2.0 micrometers and have drain extensions with a surface concentration of $5 \times 10^{17}$ impurity atoms per $cm^3$, which extend from the surface of the substrate to a depth of approximately 0.5 micrometer. These FET's exhibit drain-to-source channel currents ($I_{DS}$'s) which vary with change in their $V_{DS}$'s despite a constant potential being applied to their gate electrodes.

The present inventor has found that circuits relying upon FET's with proportional conduction characteristics may be constructed without need for additional structural elements to compensate for $I_{DS}$ variations resulting from $V_{DS}$ variations, if the FET's are constructed upon a region of semiconductor having an impurity concentration which decreases from the surface of the substrate toward the center of the substrate material, e.g., as provided by a p-well in an n-substrate, and are provided with drain extensions which extend relatively deep into the substrate regions. Such FET structure, although previously known per se, has been found by the present inventor to exhibit $I_{DS}$ characteristics that are substantially unaffected by $V_{DS}$ changes, a phenomenon that has not been previously reported, is surprising, and would not be expected from normal theoretical considerations.

An improved current amplifier, of the type having input, output and common terminals and which is subject to having widely dissimilar voltages at its input and output terminals embodies the present invention. It is formed with master and slave field effect transistors in a region, or in respective regions, of semiconductor substrate having an impurity concentration with a graded profile such that the material resistivity increases in a direction into the substrate and with relatively deep drain extensions, the extensions also having impurity concentrations with graded profiles.

Figure 1:
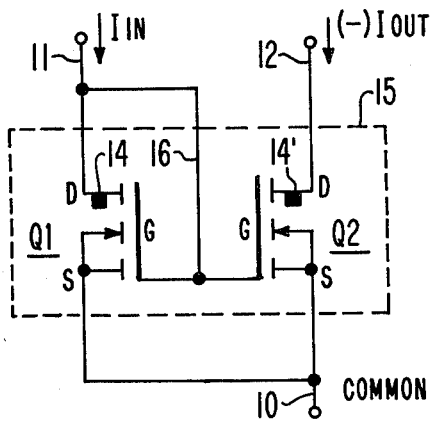
FIGS. 1, 3 and 4 are circuit schematics of three embodiments of the present invention.

The circuit of FIG. 1 has modified FET's Q1 and Q2 arranged as a current amplifier having a current output at terminal 12. FET Q1 having feedback connection 16 between its drain and gate electrodes is responsive to input current applied to 11 and generates a gate-to-source potential, or $V_{GS}$, commensurate with the current conducted as $I_{DS}$ by its drain-to-source conduction path. This potential, applied as a gate-to-source potential by interconnection 16 to similar FET Q2, causes current to flow in its drain-source conduction path, which current is applied to output terminal 12. The drain-source current ratio of Q1 to Q2, or current gain, of the circuit is determined by the ratio of the planar dimensions of the channel regions of the two FET's. For a given gate-to-source potential the drain-source current $I_{DS}$ of an FET ideally is proportional to its channel width, w, and inversely proportional to the length, l, between its source and drain regions, or, $I_D$-$s \alpha w/l$. In light of this, the gain, G, of the circuit with respect to Q1 and Q2 ideally is given by $G_{12} = W_2 l_1/W_1 l_2$ where subscripts 1 and 2 refer to FET's Q1 and Q2 respectively.

In the FIG. 1 the dashed enclosure 15 indicates a region of semiconductor material in which the respective FET's Q1 and Q2 are formed, in which region the concentration of impurity material is graded. The impurity concentration is a maximum at the surface of the semiconductor substrate and diminishes in the direction toward the center of the substrate (downward in the drawing) in a substantially Gaussian distribution function. In one embodiment, where FET's Q1 and Q2 are n-channel devices, the region 15 is a p-type conductivity region disposed in a uniformly doped n-substrate and is similar to p-wells employed in bulk-silicon CMOS devices.

The black boxes 14 and 14' respectively attached to the drain electrodes of transistors Q1 and Q2 indicate that the drain regions of these FET's have extensions. Drain extensions are more particularly illustrated as regions 54 and 56 in FIG. 2. The drain extensions are formed with a generally graded concentration of impurity material having a maximum concentration at the semiconductor surface indicated by the line between 67—67'. The gradation of impurity material of the extensions follows a substantially Gaussian distribution function.

Figure 2:
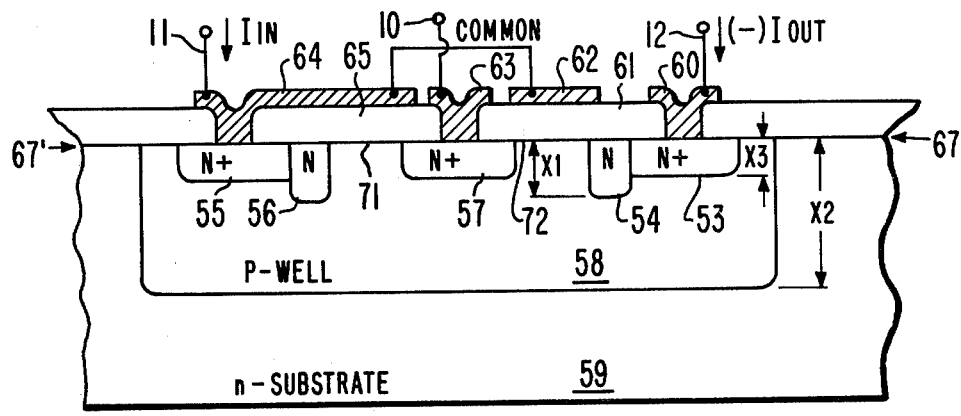
FIG. 2 is a cross-sectional view of an integrated circuit structure including an embodiment of the present invention.

Drain extensions 54(56) are formed contiguous with conventional drain regions 53(55) and are interposed adjacent to the FET channel areas 72(71) and in series with the principal conduction paths of the FET's, i.e., the drain 54(56)-to-source 57 conduction paths. The cross-section of FIG. 2 shows two FET's interconnected as a current amplifier similar to Q1 and Q2 of FIG. 1 which transistors are NMOS devices and share a common source region 57. The first and second FET's are formed of n-type drain regions 55(53) with contiguous n-type drain extensions 56(54), p-type channel regions 71(72) located between the drain extensions and the n-type source region 57, and gate insulators 65(61) and gate electrodes 64(62) disposed over the channel regions. The two FET's are formed in a single, semiconductor region 58 having the aforementioned impurity concentration gradient disposed in substrate 59 having a uniformly distributed impurity concentration. Aside from the inclusion of particular drain extensions 54(56) the structure shown in the FIG. 2 is typical of n-type FET structures as in complementary MOS technology.

The structures denoted drain regions and drain extensions might more precisely be described as drain contacts and drain regions respectively. By definition the doped regions of an FET which are adjacent to the channel area for receiving charge carriers injected by the source regions are "drain" regions, which function in the present invention is performed by the "drain extensions". The more heavily doped regions denoted "drain regions" in the present invention merely provide a means for making ohmic contact between the extensions and interconnecting electrodes and are thus more properly described drain contacts. It is conventional practice, however, to refer to the more heavily doped areas as "drain regions" and the more lightly doped areas as "drain extensions", as previously described; and the remainder of this disclosure will use this convention.

The drain extensions 54(56) in FIG. 2 are shown contiguous with the drain regions 53(55) adjacent to the respective channel regions but are not limited to this configuration. The drain extensions may in fact entirely encompass the drain regions with the more heavily doped drain regions providing only a means of establishing ohmic contact with the drain extensions. Further, extensions may be formed in like manner with the FET source regions providing further improvement of the overall performance of the CMA.

It has been found that a current amplifier formed with FET's having the combination of relatively lightly doped drain extensions of graded impurity concentration disposed in a semiconductor material also having a graded impurity concentration, which drain extension and semiconductor material concentrations are substantially Gaussian distributions, operates with a markedly improved input to output current transfer function irrespective of potential differences between input and output terminals. Further, the parameters of the structure are not limited to particular absolute quantities to achieve device improvement, but rather are fixed to relative values. More than one recipe has successfully produced the desired results. The necessary requirement is that the impurity concentrations of both the drain extensions, and the semiconductor in which they are disposed have a graded profile. The impurity distributions are presumed to be Gaussian by reason of the mode of device manufacture, that is thermal diffusion. However, the small dimensions associated with the semiconductor regions, in a direction normal to the semiconductor surface, render measurement of the impurity distribution all but impossible. The reasons for the combination of graded drain extension and graded substrate producing the circuit improvement are not known to the inventor. It has been surmised that the depletion or space charge region, and its associated potential, formed at the metallurgical junction of the drain extensions and the region in which they are disposed, deviate sufficiently from a normal structure (one formed in a semiconductor with a uniform impurity concentration) to either inhibit the mechanisms for channel shortening or cause them to occur away from the transistor channel area.

A particular example, applied to the structure of FIG. 2, is characterized by a uniformly doped n-substrate, 59, having a uniform impurity concentration of $1-2\times10^{15}$ atoms per cm$^3$; a diffused graded p-well, 58, disposed in substrate 59 and extending a distance (X2) of 5 micrometers from the semiconductor surface 67, and having a surface concentration of impurity atoms of $2.6\times10^{16}$ atoms per cm$^3$, diffused, graded n-type drain extensions 54(56) disposed in semiconductor region 58 and extending a distance (X1) of 2.7 micrometers from the semiconductor surface 67, and having a surface concentration of impurity atoms of $1\times10^{17}$ per cm$^3$; degenerate n-type drain regions 53(55) disposed in semiconductor region 58 and extending a distance (X3) of 2 micrometers from the surface 67 and having an essentially uniform impurity concentration of $10^{20}$ atoms per cm$^3$; and wherein all of the aforementioned parameters have a tolerance of at least 10%.

Figure 3:
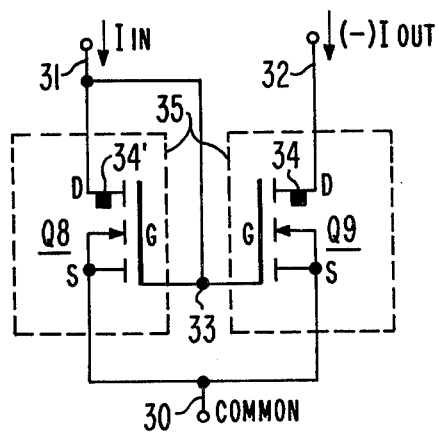

FIG. 3 shows a further embodiment of the invention in which the component FET's, Q8 and Q9, are divided into separate isolated sub-regions 35. This arrangement provides added flexibility in the layout of the integrated circuit. FET's Q8 and Q9, however, should be in sufficiently close proximity to insure thermal couplings so that Q8 and Q9 are simultaneously responsive to temperature changes. There is no apparent difference in circuit performances between circuit arrangements where the FET's are formed in separate semiconductor regions as in FIG. 3 or in a common region as in FIGS. 1 and 2.

Figure 4:
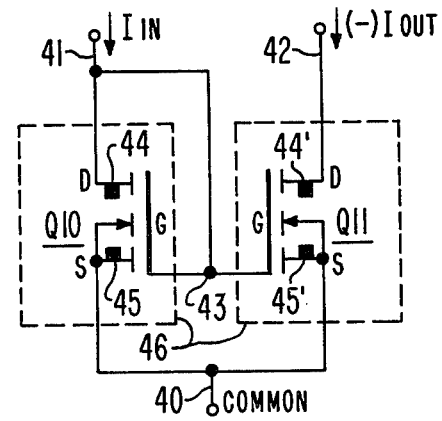

The circuit of FIG. 4 is identical to FIG. 3 save for the added inclusion of source extensions indicated by regions 45 and 45' respectively on FET's Q10 and Q11, which extensions are generally included as an expedient to processing but also provide a small amount of effective degeneration resistance in the source connections of each of the transistors further improving the linearity of the circuit. Typically FET channel extremities, i.e., the internal edges of the regions defining the effective drain and source regions, are formed via a common photomask step in order to achieve maximum dimensional precision. This implies that drain and source regions are formed simultaneously of similar constituents (drain extensions) especially where the channel length is a few micrometers or less. Forming FET's with extensions at the drain region only is possible; however, dimensional accuracy of the channel length, l, is less than that which can be realized for an FET having both source and drain extensions. Dimensional precision is a factor in establishing a desired gain G of the current amplifier.

Further output transistors can be interconnected with a current amplifier of the type described to provide additional independent output currents by connecting their gate and source electrodes respectively to the gate and source electrodes of the amplifier output FET, such as Q2 in FIG. 1 for example. Due to the feature of FET gate electrodes passing essentially no current, a relatively large number of such transistors may be paralleled as is known by those skilled in the art. These further output transistors may be formed in a semiconductor region with other transistors comprising the amplifier, which region may be divided into separate isolated sub-regions including respective ones of the transistors.

While the invention has been described in terms of the circuits shown, one skilled in the art and armed with the foregoing disclosure may construct other embodiments within the spirit of the invention; and the claims should be construed accordingly. For example, in the instance transistors Q1 and Q2 are formed within a single semiconductor region, their respective source regions may be separate and distinct or alternatively, they may be subsumed in a single source region as is shown in FIG. 2.

What is claimed is:

1. An improved current amplifier of the type having an input terminal, an output terminal and a common terminal and including first and second insulated gate field effect transistors, said transistors being formed in a first semiconductor region of first impurity type, and having respective drain and source semiconductor regions of a second impurity type disposed in said first semiconductor region, said first and second impurity types forming opposite conductivity type regions; and means connecting said first transistor between said input and common terminals for operating it as a master mirroring transistor; and means connecting said second transistor between said output and common terminals for operating it as a slave mirroring transistor, the current gain of said current amplifier being ideally determined by the ratio of the geometric dimensions of said master and slave mirroring transistors, which amplifier circuit is of the type subject to having dissimilar potentials on said input and output terminals, said amplifier being improved for essentially eliminating the tendency for the dissimilar potentials to disturb the ideal current gain, the improvement comprising:

said first semiconductor region having a diffusion graded impurity concentration which has a maximum of impurity atoms at its surface;

drain extensions, which are contiguous with the drain regions of said first and second transistors, are of said second impurity type, and have a lesser impurity concentration than said drain regions, the impurity concentration having a diffusion graded profile with a maximum of impurity atoms at the semiconductor surface; and said drain extensions being formed in the drain-to-source conduction channels of said first and second transistors and extending sufficiently into said first region from its surface to eliminate the effect of channel shortening.

2. A current amplifier as set forth in claim 1 wherein said first semiconductor region is a well in a further semiconductor region of said second impurity type, said further region having a uniform impurity distribution, the interface between said well and said further region forming a pn junction.

3. A current amplifier as set forth in claim 1 wherein the impurity concentration of said first semiconductor region has a profile which is substantially a Gaussian distribution function; and the impurity concentration of said drain extensions have a profile which is substantially a Gaussian distribution function.

4. A current amplifier as set forth in claim 1 wherein said first and second transistors include source extensions formed contiguous with their respective source regions and formed in a similar manner as their respective drain extensions.

5. A current amplifier as set forth in claim 3 wherein said first and second transistors include source extensions formed contiguous with their respective source regions and formed in a similar manner as their respective drain extensions.

6. A current amplifier as set forth in claims 1, 2, 3, 4 or 5 wherein said first semiconductor region is divided into separate isolated portions each containing a respective one of said first and second transistors said separate portions being disposed within a substrate material of opposite conductivity type to said first region.

* * * * *

UNITED STATES PATENT AND TRADEMARK OFFICE
CERTIFICATE OF CORRECTION

PATENT NO. : 4,199,733

DATED : April 22, 1980

INVENTOR(S): Otto H. Schade, Jr.

It is certified that error appears in the above-identified patent and that said Letters Patent is hereby corrected as shown below:

Col.3, lines 31 & 32, "$I_{D\_S}\alpha w/1$" should be --$I_{DS} \alpha w/l$-- where l is the letter "el".

line 34, "$G_{12}=W_2 l_\ell / W_\ell l_2$" should be

--$G_{12}=w_2 l_1 / w_1 l_2$--where non-subscript l is the letter "el".

Signed and Sealed this

*Fifteenth* Day of *July 1980*

[SEAL]

*Attest:*

SIDNEY A. DIAMOND

*Attesting Officer*     *Commissioner of Patents and Trademarks*